US006825482B1

United States Patent
Oh et al.

(10) Patent No.: US 6,825,482 B1
(45) Date of Patent: Nov. 30, 2004

(54) ION IMPLANTATION SYSTEM FOR MANUFACTURING SEMICONDUCTOR DEVICE

(76) Inventors: Sang Guen Oh, Samsung 2nd Apt. 2-801, Maetan 2-dong, Paldal-gu, Suwon-city, Kyungki-do (KR); Jueng Gon Kim, Samsung 3rd Apt. 6-504, Maetan-dong, Paldal-gu, Suwon City, Kyungki-do (KR); Tae Hyo Ro, Donshinart Villa 307, 1503-1 Socho 3-dong, Socho-gu, Seoul (KR)

( * ) Notice: Subject to any disclaimer, the term of this patent is extended or adjusted under 35 U.S.C. 154(b) by 0 days.

(21) Appl. No.: 08/925,052

(22) Filed: Sep. 8, 1997

(30) Foreign Application Priority Data

Sep. 11, 1996 (KR) .......................................... 96-039407

(51) Int. Cl.[7] .............................................. H01J 37/30
(52) U.S. Cl. ............................ 250/492.21; 250/396 ML
(58) Field of Search ........................ 250/299, 396 ML, 250/492.21

(56) References Cited

U.S. PATENT DOCUMENTS 4,524,275 A * 6/1985 Cottrell et al. ............... 250/299
5,389,793 A * 2/1995 Aitken et al. ........... 250/492.21

* cited by examiner

Primary Examiner—Bruce C. Anderson

(57) ABSTRACT

An ion implantation system for manufacturing semiconductor devices includes an ion generator, an ion extractor, an ion converter, an ion mass analyzer, an ion accelerator, an ion focusing device and an end station where a wafer is located and an ion beam is implanted, which are installed along the path of an ion beam. A first portion of the system, including the ion generator, ion extractor, ion converter, ion mass analyzer is arranged along a first horizontal layer. A remaining portion of the system is arranged along a second horizontal layer vertically removed from the first layer. As a result, floor space required for the ion implantation system is reduced, thereby lowering manufacturing costs.

5 Claims, 1 Drawing Sheet

ION IMPLANTATION SYSTEM FOR MANUFACTURING SEMICONDUCTOR DEVICE

BACKGROUND OF THE INVENTION

1. Field of the Invention

The present invention relates to an ion implantation system for manufacturing a semiconductor device, and more particularly, to an ion implantation system for manufacturing a semiconductor device in which the arrangement of system components is compacted to save space.

2. Background of the Related Art

In general, ion implantation equipment in an apparatus for manufacturing semiconductor devices can regulate the concentration of impurities within a range of $10^{14}$–$10^{18}$ atoms/cm$^2$. Since ion implantation technology can control impurity concentration more easily than other impurity implantation technologies such as diffusion, and since the depth of ion implantation can be performed accurately, ion implantation equipment is being more widely used as the integration of semiconductor devices increases.

A conventional ion implantation system includes an ion source, an ion extractor, an ion mass analyzer, an ion accelerator, and an end station constituted by an ion concentrator, a disk for placing a wafer thereon and a Faraday cup assembly.

High voltages of various levels must be supplied to each of the above components for ion decomposition, extraction and acceleration. As the high voltages are supplied, gas which is provided from an ion generator is converted to a plasma state. Then, electrons are extracted by an electric field formed by the applied voltage. Desired ions from among the extracted ions are refracted, accelerated, and focused to thereby implant impurity ions at an appropriate depth in the wafer.

FIG. 1 schematically depicts a conventional ion implantation system. A process of implanting impurity ions into a semiconductor device will be described referring to FIG. 1.

Impurities in a gas or solid state are provided to an ion generator 12 from an impurity supplying source (not shown), including the impurities to be ion-implanted. The ion generator 12 includes a separate power source and vacuum pump to ionize the impurities by generating a plasma.

The positive ions or negative ions generated from the ion generator 12 are extracted from the ion generator 12 through an ion extracting aperture 13 by applying an appropriate voltage to the ion extractor. The extracted positive ions or negative ions can be converted into negative ions or positive ions, respectively, in an ion converter 14 with a magnesium medium.

The impurity ions that are converted into negative ions pass through an ion mass analyzer 16 and are separated by virtue of the fact that the radius of refraction of ions will differ in a magnetic field according to the mass thereof.

The ion beam 26 then enters an ion accelerator 18 having a separate voltage source where the negative ions are accelerated to attain a high energy level. Then, the ion beam 26 passes through a focusing means, such as a Tendetron chamber 20, where it is concentrated, scanned and charge-divided for implantation into a predetermined portion of a wafer 10 located on a disk 22.

The disk 22 includes a Faraday cup assembly 24 for measuring the implantation dosage amount. The Faraday cup assembly 24 is provided with a reverse voltage for restricting secondary ions resulting from the ion implantation. A measurement meter 28 for measuring the implantation dose amount with reference to the beam current is also provided.

In the conventional ion implantation system as shown in FIG. 1, the ion mass analyzer 16 is installed such that the ion beam is refracted horizontally and all the ion implantation system component devices, from the ion generator 12 to the disk 22 where the wafer 10 is located, are installed on the same horizontal plane as the semiconductor manufacturing equipment.

Thus, the conventional ion implantation system suffers a disadvantage in that the manufacturing equipment occupies a great deal of space. This large space requirement conflicts with present desires and trends to reduce equipment size due to the high price of manufacturing space.

SUMMARY OF THE INVENTION

The present invention provides an ion implantation system for manufacturing a semiconductor device in which the equipment utilizes less manufacturing floor space.

This and other objects of the present invention are achieved by an ion implantation system, having a plurality of components installed along the path of an ion beam, for manufacturing a semiconductor device, wherein certain ones of the plurality components are arranged on a first horizontal plane and remaining ones of the plurality of components are arranged on a second horizontal plane.

The plurality of components comprising: an ion generator; an ion extractor; an ion converter; an ion mass analyzer; an ion accelerator; an ion focusing device; and an end station where a wafer is located for ion implantation, with the ion generator, the ion extractor, the ion converter, and the ion mass analyzer being arranged along the first horizontal plane, and the ion accelerator, the ion focusing device, and the end station being arranged along the second horizontal plane.

The first and second horizontal layers are vertically separated, and preferably, the first horizontal layer is vertically lower than the second horizontal layer. The ion mass analyzer is installed to operate such that ion beams passing therethrough are refracted vertically, whereby the ion beam path commences along the first horizontal plane, passes through the ion mass analyzer, is vertically refracted to the second horizontal plane, and is implanted into the wafer along the second horizontal plane.

It should be understood that both the foregoing general description and the following detailed description are explanatory and are intended to provide further explanation of the invention as claimed.

BRIEF DESCRIPTION OF THE DRAWINGS

The accompanying drawings illustrate an embodiment of the present invention, in which.

DETAILED DESCRIPTION OF THE PREFERRED EMBODIMENT

Figure 1:
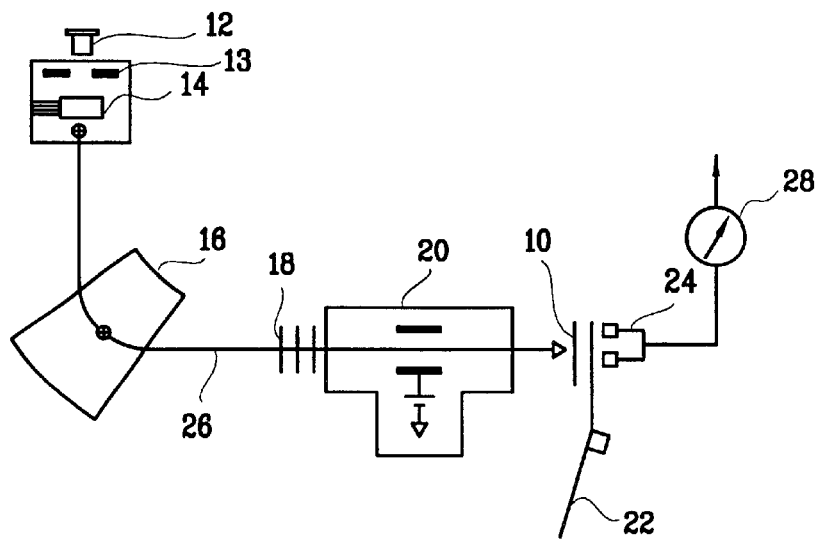
FIG. 1 is a schematic diagram depicting a conventional ion implantation system for manufacturing a semiconductor device.
Figure 2:
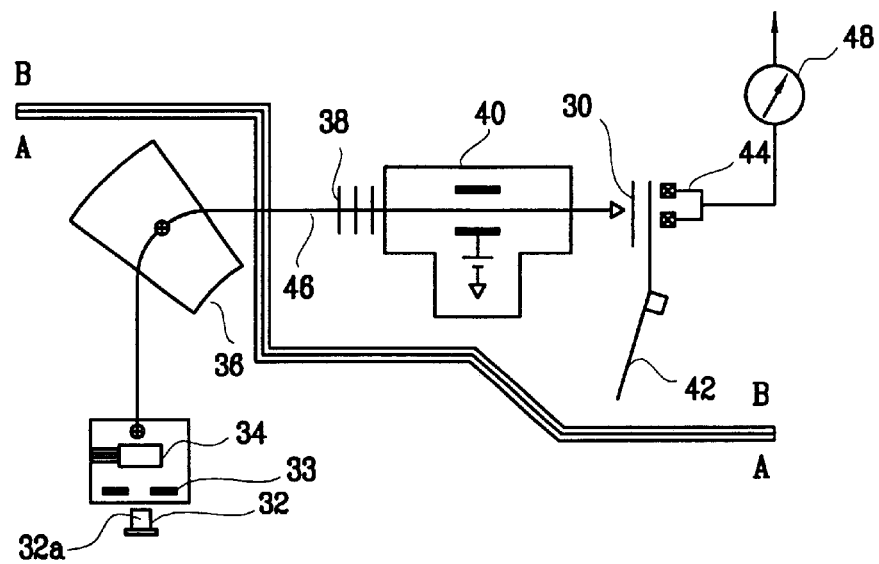
FIG. 2 is a schematic diagram depicting an ion implantation system for manufacturing a semiconductor device according to the present invention.

Referring to FIG. 2, an ion implantation system is installed as a two plane, or two layer, structure comprising a first horizontal layer A, which includes a base layer of the semiconductor device manufacturing equipment, and a second horizontal layer B, which includes a manufacturing line where the semiconductor device manufacturing process proceeds. Preferably, the second horizontal layer is positioned above, or is oriented at a higher vertical plane than the first horizontal layer A. It is understood, however, that the opposite arrangement is also contemplated within the scope of the present invention.

The system of the present invention includes an ion generator 32, to which impurities are supplied in a gas or solid state from an impurity supplying source (not shown), including impurities to be ion implanted. An ion extracting aperture 33 extracts positive ions generated from the ion generator 32 by applying an appropriate voltage. Preferably, an inlet 32a is installed at a side surface of the ion generator 32 for supplying the impurities to be ion-implanted so as not to interfere with the extraction of the ion beam. An ion converter 34 converts the extracted positive ions into negative ions. An ion mass analyzer 36 is used for separating desired ions based upon a different refraction radius for each different ion mass passing through a magnetic field. The ion generator 32, ion extractor 33, ion converter 34 and ion mass analyzer 36 are arranged in order on the first horizontal layer A, containing the underlayer of the semiconductor manufacturing line.

The second horizontal layer B includes a tube type ion accelerator 38, having a separate power source, where the negative ions are accelerated to attain a high energy level. Then, the ion beam 46 passes through a focusing means, such as a Tendetron chamber 40, where it is concentrated, scanned and charge-divided for implantation into a predetermined portion of a wafer 30 located on a disk 42.

The disk 42 includes a Faraday cup assembly 44 for measuring the implantation dosage amount. The Faraday cup assembly 44 is provided with a reverse voltage for restricting secondary ions resulting from the ion implantation. A measurement meter 48 measures the implantation dose amount with reference to the beam current.

In the present invention, the ion mass analyzer 46 is installed and oriented to operate such that ion beams passing therethrough are refracted vertically, rather than horizontally as in the conventional apparatus. Accordingly, in the present invention, the ion beam path commences along the first horizontal layer A, passes through the ion mass analyzer 36, is vertically refracted to the second horizontal layer B, and is implanted into the wafer 30 along the second horizontal layer B.

The component units on the second horizontal layer B, from the ion accelerator 38 to the end station 42 where the disk 30 is installed, can be adjusted to any appropriate vertical height.

Thus, according to the present invention, a second portion of the ion implantation system, from the ion accelerator to the end station is installed at a second horizontal layer, above the first horizontal layer. Accordingly, the amount of horizontal manufacturing floor space required for the present invention is sharply reduced. Such a space reduction reduces manufacturing costs through more efficient use of factory space.

While a preferred embodiment of the present invention has been described, it will be understood by those skilled in the art that various changes and modifications may be made, and equivalents may be substituted for elements thereof without departing from the true scope of the present invention. Therefore, it is intended that the present invention not be limited to the particular embodiment disclosed, but that the present invention include all embodiments falling within the scope of the appended claims.

What is claimed is:

1. An ion implantation system, comprising a plurality of components for manufacturing a semiconductor device installed along the path of an ion beam, wherein certain ones of said plurality components are arranged on a first horizontal plane and remaining ones of said plurality of components are arranged on a second horizontal plane, said second horizontal plane being vertically separated from said first horizontal plane by an amount sufficient to utilize space under one of said first horizontal plane and said second horizontal plane, wherein said ion mass analyzer is installed to operate such that ion beams passing therethrough are refracted vertically, whereby said ion beam path commences along said first horizontal plane, passes through said ion mass analyzer, is vertically refracted to said second horizontal plane, and is implanted into said wafer along said second horizontal plane.

2. An ion implantation system as claimed in claim 1, said plurality of components comprising: an ion generator; an ion extractor; an ion converter; an ion mass analyzer; an ion accelerator; an ion focusing device; and an end station where a wafer is located for ion implantation.

3. An ion implantation system as claimed in claim 2,
wherein said ion generator, said ion extractor, said ion converter, and said ion mass analyzer are arranged along the first horizontal plane, and
said on accelerator, said ion focusing device, and said end station are arranged along the second horizontal plane.

4. An ion implantation system as claimed in claim 1, wherein said ion generator is installed such that impurities to be ion-implanted are provided at a side of said ion generator.

5. An ion implantation system as claimed in claim 1, wherein the amount of the vertical separation between said first horizontal plane and said second horizontal plane is adjustable.

* * * * *